(12) United States Patent
Greve et al.

(10) Patent No.: US 10,500,661 B2
(45) Date of Patent: Dec. 10, 2019

(54) METHODS AND APPARATUSES FOR HIGH TEMPERATURE BONDING CONTROLLED PROCESSING AND BONDED SUBSTRATES FORMED THEREFROM

(71) Applicants: Toyota Motor Engineering & Manufacturing North America, Inc., Erlanger, KY (US); University of Maryland, College Park, College Park, MD (US)

(72) Inventors: Hannes Martin Hinrich Greve, Hyattsville, MD (US); F. Patrick McCluskey, Ellicott City, MD (US); Shailesh N. Joshi, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 285 days.

(21) Appl. No.: 15/344,532

(22) Filed: Nov. 6, 2016

(65) Prior Publication Data
US 2017/0129031 A1    May 11, 2017

Related U.S. Application Data

(60) Provisional application No. 62/252,166, filed on Nov. 6, 2015.

(51) Int. Cl.
*B23K 37/00* (2006.01)
*B23K 1/00* (2006.01)
(Continued)

(52) U.S. Cl.
CPC .......... *B23K 1/0016* (2013.01); *B23K 3/0478* (2013.01); *B23K 3/085* (2013.01);
(Continued)

(58) Field of Classification Search
CPC ... H01L 24/75; H01L 2224/755–75502; H01L 2224/7525–75253; B23K 1/0016; B23K 20/026; B23K 20/02; B23K 20/023
(Continued)

(56) References Cited

U.S. PATENT DOCUMENTS 3,173,813 A * 3/1965 Dewey ................. B23K 1/0014
                                                      148/517
3,737,978 A * 6/1973 Rathbun .............. B23K 1/0014
                                                      228/190
(Continued)

FOREIGN PATENT DOCUMENTS

DE         19545984 A1 * 6/1997  ................ F27B 3/24

*Primary Examiner* — Erin B Saad
*Assistant Examiner* — Carlos J Gamino
(74) *Attorney, Agent, or Firm* — Dinsmore & Shohl LLP (57) ABSTRACT

Methods and apparatuses for controlled processing of high temperature bonding systems via devices to control heating and cooling systems of a high temperature heating bonding includes use of a sinter fixture device including a plate surface, that is shaped to contact and conform to a contacting surface of a TLPS substrate assembly, and a plurality of channels below the plate surface within a base body of the sinter fixture device shaped to receive heating and cooling elements. A first set of the one or more channels includes a plurality of cross-channels, a cooling medium inlet, and a cooling medium outlet, which cross-channels, cooling medium inlet, and cooling medium outlet are in fluid communication with one another. A second set of the one or more channels includes a plurality of heating element passageways.

17 Claims, 9 Drawing Sheets

(51) Int. Cl.
*B23K 3/08* (2006.01)
*B23K 3/047* (2006.01)
*B23K 35/26* (2006.01)
*C22C 13/00* (2006.01)
*H01L 23/00* (2006.01)
*B23K 20/02* (2006.01)
*B23K 20/233* (2006.01)
*B23K 20/26* (2006.01)
*B23K 101/42* (2006.01)

(52) U.S. Cl.
CPC .......... *B23K 20/026* (2013.01); *B23K 20/233* (2013.01); *B23K 20/26* (2013.01); *B23K 35/262* (2013.01); *C22C 13/00* (2013.01); *H01L 24/29* (2013.01); *H01L 24/75* (2013.01); *H01L 24/83* (2013.01); *B23K 2101/42* (2018.08); *H01L 24/32* (2013.01); *H01L 2224/29111* (2013.01); *H01L 2224/29294* (2013.01); *H01L 2224/29295* (2013.01); *H01L 2224/29311* (2013.01); *H01L 2224/29324* (2013.01); *H01L 2224/29347* (2013.01); *H01L 2224/29355* (2013.01); *H01L 2224/32227* (2013.01); *H01L 2224/32245* (2013.01); *H01L 2224/75102* (2013.01); *H01L 2224/75251* (2013.01); *H01L 2224/75501* (2013.01); *H01L 2224/75901* (2013.01); *H01L 2224/8309* (2013.01); *H01L 2224/8381* (2013.01); *H01L 2224/83825* (2013.01); *H01L 2224/83908* (2013.01); *H01L 2924/10253* (2013.01); *H01L 2924/10272* (2013.01)

(58) Field of Classification Search
USPC ........................................................ 266/241
See application file for complete search history.

(56) References Cited

U.S. PATENT DOCUMENTS

| | | | |
|---|---|---|---|
| 4,008,619 A * | 2/1977 | Alcaide | G01L 9/0051 29/593 |
| 5,002,219 A * | 3/1991 | Cadwell | B23K 20/02 228/155 |
| 5,298,470 A | 3/1994 | Chia et al. | |
| 6,855,917 B2 * | 2/2005 | Matsen | B29C 33/02 219/634 |
| 6,897,419 B1 * | 5/2005 | Brown | H05B 6/105 219/634 |
| 8,987,875 B2 | 3/2015 | Berlin et al. | |
| 2003/0124829 A1 * | 7/2003 | Pace | B81C 1/00333 438/612 |
| 2007/0251925 A1 * | 11/2007 | Matsuzaki | B23K 20/02 219/78.02 |
| 2010/0224674 A1 | 9/2010 | Liu et al. | |
| 2011/0256257 A1 * | 10/2011 | Hughes | B23P 15/007 425/547 |
| 2013/0319762 A1 | 12/2013 | Harris et al. | |
| 2014/0102616 A1 * | 4/2014 | Lu | H01L 24/75 156/64 |
| 2014/0177132 A1 | 6/2014 | McConnell et al. | |
| 2014/0202636 A1 * | 7/2014 | Mayr | B29C 66/9121 156/378 |
| 2015/0008253 A1 | 1/2015 | Yoon et al. | |
| 2015/0016083 A1 * | 1/2015 | Nootens | H01C 17/00 361/820 |
| 2015/0173209 A1 * | 6/2015 | Dhavaleswarapu | B23K 3/085 228/194 |
| 2016/0126213 A1 * | 5/2016 | Celia, Jr. | B23K 37/0408 228/101 |

* cited by examiner

METHODS AND APPARATUSES FOR HIGH TEMPERATURE BONDING CONTROLLED PROCESSING AND BONDED SUBSTRATES FORMED THEREFROM

CROSS REFERENCE TO RELATED APPLICATIONS

The present specification claims priority to U.S. Provisional Patent Application Ser. No. 62/252,166, filed Nov. 6, 2015, and entitled METHODS AND APPARATUSES FOR HIGH TEMPERATURE BONDING CONTROLLED PROCESSING AND BONDED SUBSTRATES FORMED THEREFROM, the entirety of which is incorporated by reference herein.

TECHNICAL FIELD

The present specification generally relates to methods and apparatuses for controlled processing of high temperature bonding systems and substrates formed therefrom and, more specifically, to methods and apparatuses for controlled processing of high temperature bonding systems via devices to control heating and cooling systems of a high temperature heating bonding.

BACKGROUND

Power semiconductor devices, such as those fabricated from SiC (silicon carbide), may be designed to operate at very high operating temperatures (e.g., greater than 250° C.). Such power semiconductor devices may be bonded to a cooling device, such as a heat sink or a liquid cooling assembly, for example. The cooling device removes heat from the power semiconductor device to ensure that it operates at a temperature that is below its maximum operating temperature. The bonding layer that bonds the power semiconductor device to the cooling device must be able to withstand the high operating temperatures of the power semiconductor device.

Transient liquid phase (TLP) sintering (TLPS) or diffusion bonding or soldering are methods of high temperature bonding that may be used to bond one substrate to another (e.g., a power semiconductor to a cooling device). For example, TLP bonding results in a bond layer having a high temperature melting point. A typical TLP bond consists of two different material compounds: a metallic layer and an intermetallic layer or alloy. Generally, the intermetallic layer having a high-remelting temperature is formed during an initial melting phase wherein a low melting temperature material, such as tin, diffuses into high melting temperature materials, such as copper, silver, or nickel. Conventional methods for heating TLP sintered interconnect microstructures have utilized convection ovens with considerable thermal masses and gradual heating profiles. Such considerable thermal masses and gradual heating profiles may result in an increased formation of voids in a bonding layer, resulting in a weaker bonding layer.

Accordingly, a need exists for alternative methods for heating TLP sintered interconnect microstructures to form a more strengthened bonding layer with less voiding between a pair of substrates.

SUMMARY

In one embodiment, a sinter fixture device for use in a controlled processing of high temperature bonding of substrates includes a base body comprising a metal that is at least one of copper and aluminum, a plate surface that is shaped to contact and conform to a contacting surface of a substrate assembly, and a plurality of channels below the plate surface within the base body of the sinter fixture device shaped to receive heating and cooling elements. The substrate assembly includes a low melting point material and one or more high melting point materials between at least first and second substrates, the one or more high melting point materials having a melting temperature that is higher than a melting temperature of the low melting point material. For example, the substrate assembly may include such material between a plurality of substrates that include at least the first and second substrates. Such an application may involve power module sintering (though other like applications employing the bonding of a plurality of substrates are within the scope of this disclosure). A first set of the plurality of channels includes a plurality of cross-channels, a cooling medium inlet, and a cooling medium outlet, which cross-channels, cooling medium inlet, and cooling medium outlet are in fluid communication with one another. A second set of the plurality of channels includes a plurality of heating element passageways.

In another embodiment, a system for assessing high temperature bonding of substrates includes a sinter fixture device comprising a plate surface and a base body comprising one or more channels associated with one or more heating and cooling systems, a substrate assembly disposed on the plate surface of the sinter fixture device, wherein the substrate assembly includes a first substrate, a second substrate, and a low melting point material and one or more high melting point materials disposed between the first and second substrates, a processor, and a non-transitory computer-readable storage medium in communication with the processor, the non-transitory computer-readable storage medium including one or more programming instructions executable by the processor to cause the processor to control one or more heating elements associated with a first set of the one or more channels of the sinter fixture device and a flow of a cooling fluid through a second set of the one or more channels of the sinter fixture device to achieve a process temperature profile to form a bond layer between the first and second substrates. The one or more channels are disposed below the plate surface. The one or more high melting point materials have a melting temperature that is higher than a melting temperature of the low melting point material. The plate surface is shaped to contact and conform to a contacting surface of the substrate assembly.

In another embodiment, a method for controlled processing of high temperature bonding of substrates includes disposing a low melting point material and one or more high melting point materials between first and second substrates to form a substrate assembly having a contacting surface, disposing the substrate assembly on a plate surface of a sinter fixture device. The sinter fixture device includes a base body including one or more channels associated with one or more heating and cooling systems. The one or more channels are disposed below the plate surface. The method further includes controlling, by a processor, one or more heating and cooling systems within one or more channels disposed below the plate surface of the sinter fixture device to apply a process temperature profile to form a bond layer between the first and second substrates. The one or more high melting point materials have a melting temperature that is higher than a melting temperature of the low melting point material. The plate surface is shaped to contact and conform to the contacting surface of the substrate assembly.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to methods and apparatuses for controller processing of high temperature bonding of substrates to form transient liquid phase sintering (TLPS) joints or interconnects between two substrates. The embodiments described herein provide controlled processing to form and/or modify microstructures of TLPS joints in a manner that enhances the thermal and electrical performance of electronic systems and maximizes system reliability through modification of associated mechanical properties. For example, as described in greater detail below, an apparatus such as a sinter fixture device is used in a controlled processing of high temperature bonding of substrates that form an assembly including a low melting point material and one or more high melting point materials (having a higher melting point than the low melting point material) disposed between the substrates. The sinter fixture device may include a base body disposed below a plate surface that shaped to contact and conform to a contacting surface of the assembly. Further, the sinter fixture device may include a plurality of channels below the plate surface shaped to receive heating and cooling elements that may be integrated with the sinter fixture device.

Paste-based TLPS interconnects are characterized by highly complex microstructures that include intermetallic compounds ("IMCs") as matrix material and have metal particles embedded in that matrix, and inclusion of voids within the interconnects may affect the thermal, electrical and mechanical properties of these interconnects. A microstructure and properties (i.e., mechanical, electrical, and thermal) of TLPS joints depend on the development and control of a thermal history and process temperature profile in the joint region during the TLPS process. During ramping of the temperature in the temperature profile, for example, flux binders are activated to reduce oxides on joint surfaces and the paste metal particles to improve wettability and spreading of the low temperature alloys to facilitate the sintering process. Eventually, the flux binders may and should completely leave the interconnect zone, such as by outflowing or outgassing to minimize interconnect voiding (i.e., voids otherwise created by remaining or trapped gasses in the interconnect region) and to maximize joint quality and reliability. The chemical and rheological properties of the flux binders depend on the thermal history of the sintering process, and the rheological properties of the low and high temperature metal constituents of the sinter paste as well as the rate and structure of the joint process completion depend on the temperature profile.

A conventional heating and cooling approach has utilized single or multi-zone reflow ovens. Such conventional ovens operate under atmospheric air conditions, include considerable thermal masses, and have a gradual temperature profile application that may lead to an increase in voiding within the joint and a less strengthened bond between the substrates. The methods described herein are directed toward a sinter device assembly including considerably smaller thermal masses than such conventional ovens and that allows for a faster temperature profile application, which itself leads to fewer void formations and a strengthened bond layer. The sinter device assemblies described herein, further, are operable in a vacuum environment, which permits outgassing that may improve the wettability and adhesion of the bond layer between the substrates to result in a strengthened bond layer formed by the TLPS interconnects.

Substrates, such as silicon or wideband gap semiconductor devices, may be attached to metallic or ceramic substrate for power electronic applications requiring operation at high temperatures via the use of TLPS, for example. For example, through TLPS, pastes include micro-sized particles of a low melting point metal (such as tin (Sn)) and a high melting point metal (such as silver (Ag), copper (Cu), and/or nickel (Ni)) that are embedded in an organic binder that is disposed and sintered between such substrates to form connecting joints or interconnects therebetween. The embodiments described herein include providing a pair of such substrates and positioning a material such as a paste holding tin and a plurality of metal particles therebetween to form a assembly. The tin has a low melting temperature, and the plurality of metal particles have a greater high melting temperature. The paste may include an organic binder that includes the metal particles. A real-world and/or virtual paste, model, and/or optimized temperature profile may be created based on an analysis of a determination of properties of the formed assembly, as described in greater detail below.

Embodiments described herein provide for the advantages of creating a stronger bonding layers between a pair or a plurality of substrates through use of use of a sinter fixture device. The low thermal mass sinter fixture device described herein provides for faster temperature profile ramping rates due to a lower thermal mass than conventional high thermal mass oven structures. Moreover, the sinter fixture devices described herein provide for a controlled processing environment that may involve, for example, use of a vacuum environment that allows for outgassing. Conventional oven structures require an atmospheric, non-vacuum processing environment that may lead to formation of additional voids in a bond layer without the provision of outgassing. The sinter fixture device described herein may be used to apply a high temperature bonding of substrates within a virtual controlled processing environment (such as through use via computer generated simulations) and/or a real-world controlled processing environment.

Various embodiments of methods and apparatuses for high temperature bonding of substrates and substrates formed therefrom are described in detail herein. Although example methods for assessing high temperature bonding of substrates are described in the context of power electronics applications (e.g., to bond a power semiconductor device to a cooling assembly in an inverter circuit of hybrid or electric vehicles), the use of methods described herein is not limited thereto. For example, example methods and substrates formed therefrom that are described herein may be implemented in other semiconductor use applications and other applications to bond at least two components together.

Figure 1A:
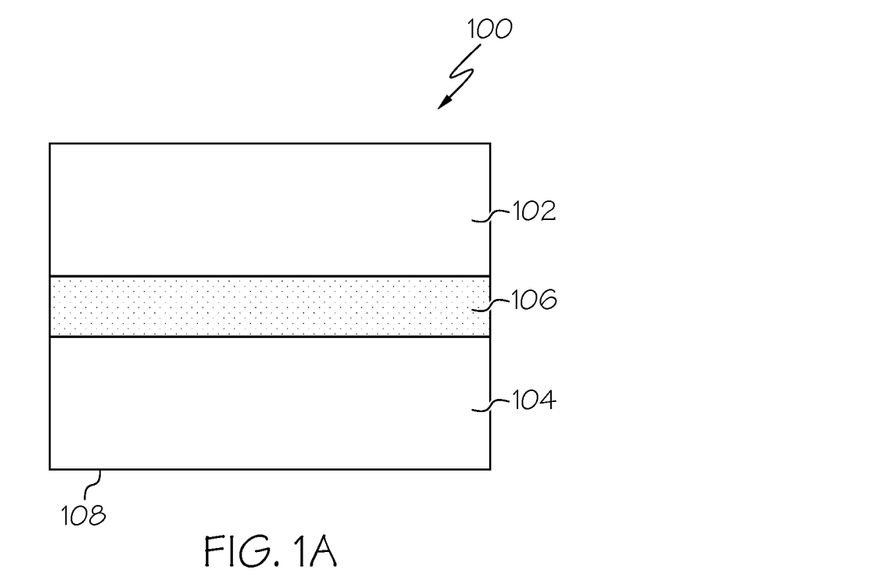
FIG. 1A schematically depicts a first bonding assembly prior to forming a bond layer between a pair of substrates via a high-temperature heating application, according to one or more embodiments shown and described herein.

FIG. 1A illustrates a schematic illustration of an example pre-bonding assembly 100 assembled and prepared for a high temperature bonding of substrates, such as a TLPS bonding, for example. Referring to FIG. 1A, a first substrate 102 and a second substrate 104 is provided. The first substrate 102 includes a die that is made of Si (silicon), SiC (silicon carbide), or the like. The second substrate 104 may include direct bonded copper, direct bonded aluminum, or the like. It should be understood that other substrates suitable for a high temperature heating application are within the scope of this disclosure.

As shown in FIG. 1A, a material 106 is positioned between the first substrate 102 and the second substrate 104 to form the pre-bonding assembly 100. As a non-limiting example, the material 106 may be a paste including sinter joint objects such as metal particles. For example, the metal particles of the paste may include at least an amount of a plurality of high melting point materials and/or an amount of a low melting point material such as tin (Sn). The low melting point material has a low melting temperature that is lower than a high melting temperature of the high melting point material. Alternatively, paste may not utilized to contain the metal particles to bond the substrates, such as in instances where a powder including metal particles is utilized. In either instance, the material 106 may include a low melting point material such as tin and one or more high melting point materials such as Ni, Cu, Ag, and/or Al. The low melting point material may be of a weight percent of 70% tin of the material 106 and the one or more high melting point materials may be of a weight percent of at least one of 30% Ni, Cu, Ag, and/or Al. For example, the one or more high melting point materials may be of a weight percent of 30% Ni. In other embodiments, the high melting point materials (e.g., Ni, Cu, Al, Ag, other suitable like metal materials, or any combination thereof) includes a weight percent of in the range of about 20% to about 40%, and the tin as the low melting point material comprises a respective weight percent in the range of about 80% to about 60%. As another non-limiting example, the amount of tin may include a weight percent of 60% tin, and the amount of the plurality of high melting point materials may include a weight percent of 40% Ni and/or Cu. Or the amount of tin may include a weight percent of 80% tin, and the amount of the plurality of high melting point materials may include a weight percent of 20% Ag.

Figure 1B:
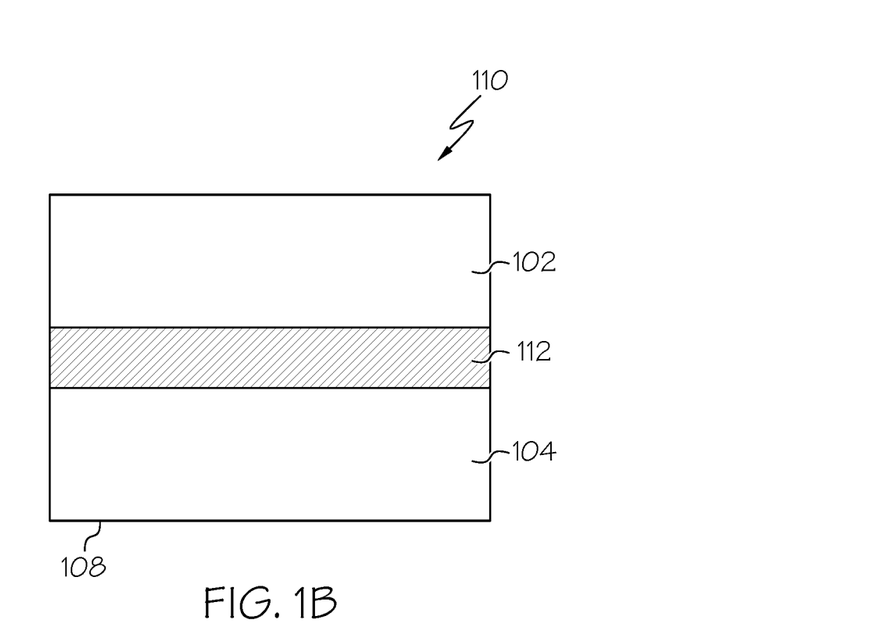
FIG. 1B schematically depicts the first bonding assembly of FIG. 1A after undergoing the high-temperature heating application, in which the first bonding assembly has a formed bond layer between the pair of substrates, according to one or more embodiments shown and described herein.

Referring to FIG. 1B, upon a high temperature heating, the material 106 as a paste holding an amount of tin and metal particles forms IMCs, or intermetallic alloys, and a bond layer 112 of a bonded assembly 110. For example, the heating may be part of a TLPS heating or soldering or a diffusion soldering process as conventionally known and applied in a controlled processing environment as described herein.

Figure 2:
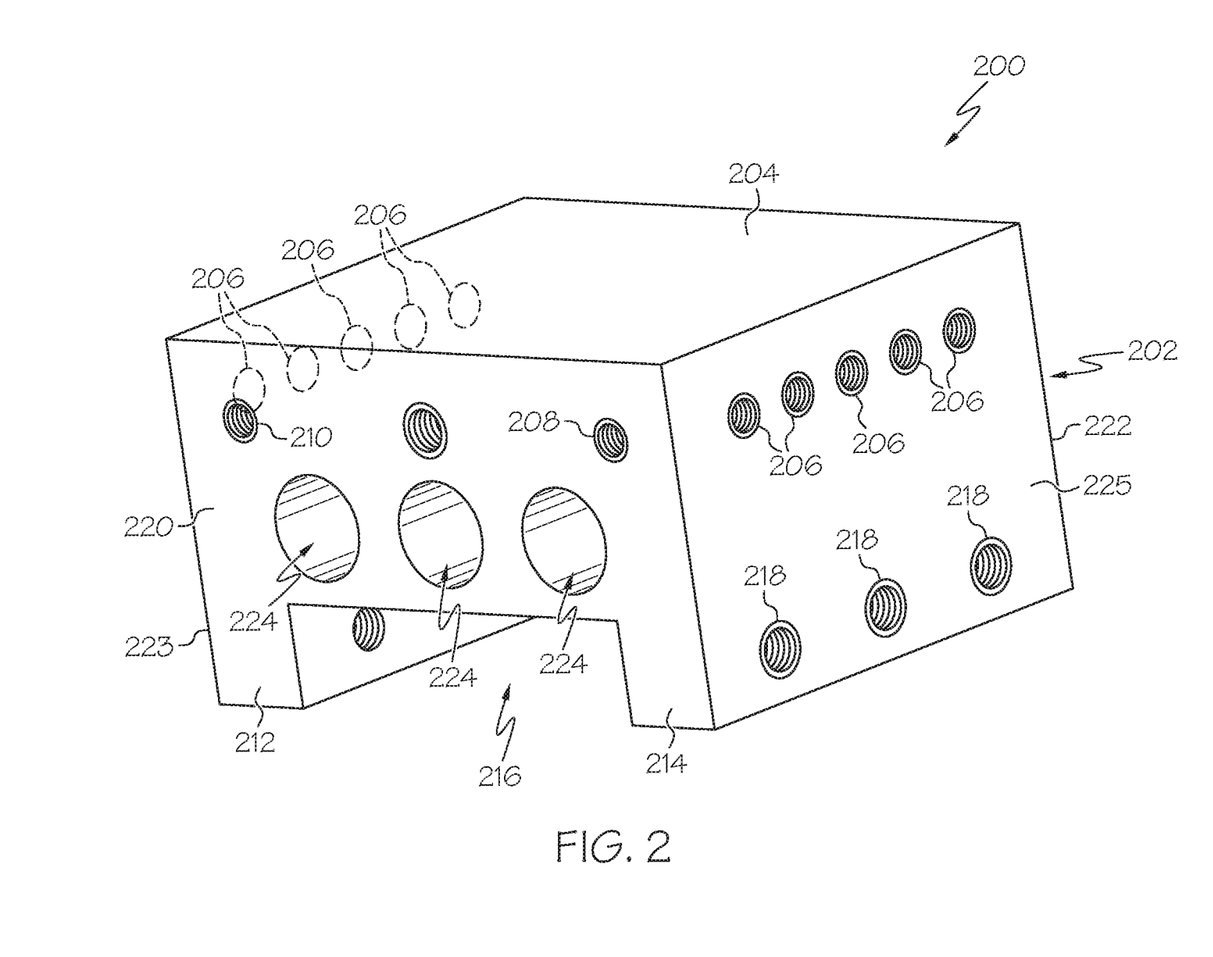
FIG. 2 schematically depicts a front perspective view of a sinter fixture device to form transient liquid phase sintering ("TLPS") interconnects or joints between a pair of substrates, according to one or more embodiments shown and described herein.
Figure 3:
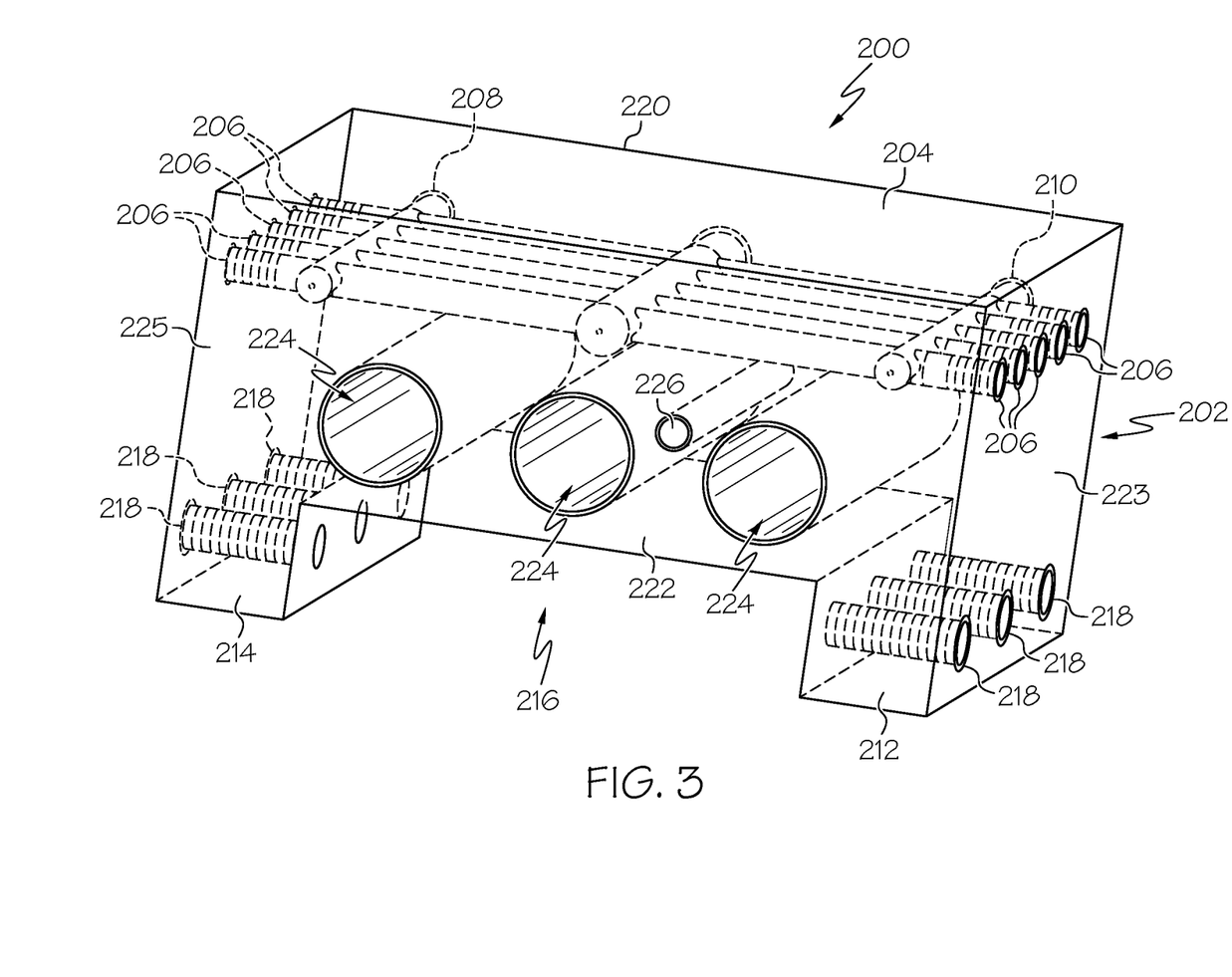
FIG. 3 schematically depicts a rear perspective view of the sinter fixture device of FIG. 2, according to one or more embodiments shown and described herein.

FIG. 2 is a front perspective view of a sinter fixture device 200 to form TLPS joints between a pair of substrates, while FIG. 3 is a rear perspective view of the same. Referring to FIGS. 2-3, the sinter fixture device 200 for high temperature bonding of substrates includes a base body 202 and a plate surface 204, wherein the base body 202 is disposed below the plate surface 204. The plate surface 204 may be an integral component of or a separable component attached to the base body 202. The plate surface 204 may be a hot and/or cold plate that is made of a thermally conductive material, examples of which include, but are not limited to, copper, aluminum, and thermally conductive polymers. The plate surface 204 is shaped to contact and precisely conform to a contacting surface of a specimen made of a low melting point material and one or more high melting point materials disposed between top and bottom substrates. The base body 202 may be made of copper, aluminum, or a suitable like metal.

The base body 202 includes access points, such as channels, allowing for integration and accessibility of heating and cooling elements. For example, the one or more cooling systems are associated with a first set of the one or more channels including a plurality of cross-channels, a cooling medium inlet, and a cooling medium outlet, which cross-channels, cooling medium inlet, and cooling medium outlet are in fluid communication with one another. Referring to FIG. 3, the base body 202 includes a plurality of cooling loop cross-channels 206 extending between sidewalls 223, 225 and that are internally coupled with a cooling medium inlet 208 and a cooling medium outlet 210. The cooling medium inlet 208 and the cooling medium outlet 210 are defined by a respective pair of apertures disposed within a first surface 220 (FIG. 2) of the sinter fixture device 200 that extends between ends of the sidewalls 223, 225. The cross-channels 206 may be macro and/or micro channels that are used to maximize a surface area for a convective heat transfer between the apparatus and a cooling medium disposed within the channels.

Further, the one or more heating systems are associated with a second set of the one or more channels including a heating element passageways 224 remotely positioned away from the first set of the one or more cooling medium channels. Heating elements may be disposed within the heating element passageways 224 and may include, but not limited be to, resistive, inductive, or thermoelectric elements. Cooling elements utilized with the sinter fixture device 200 may be, but are not limited to, thermoelectric elements and/or channel structures that are contact with fluid cooling mediums during a cooling phase. The integration of heating and cooling elements in the sinter fixture device 200 improves a thermal contact between the elements and the apparatus and minimized thermal resistivity and thermal capacity. Such minimization leads to a reduction in a thermal time constant of the sinter fixture device 200 and a maximization of achievable heating and cooling rates, which in turn may lead to less void formation in the resulting bond layer to form a strengthened bond layer.

Figure 7:
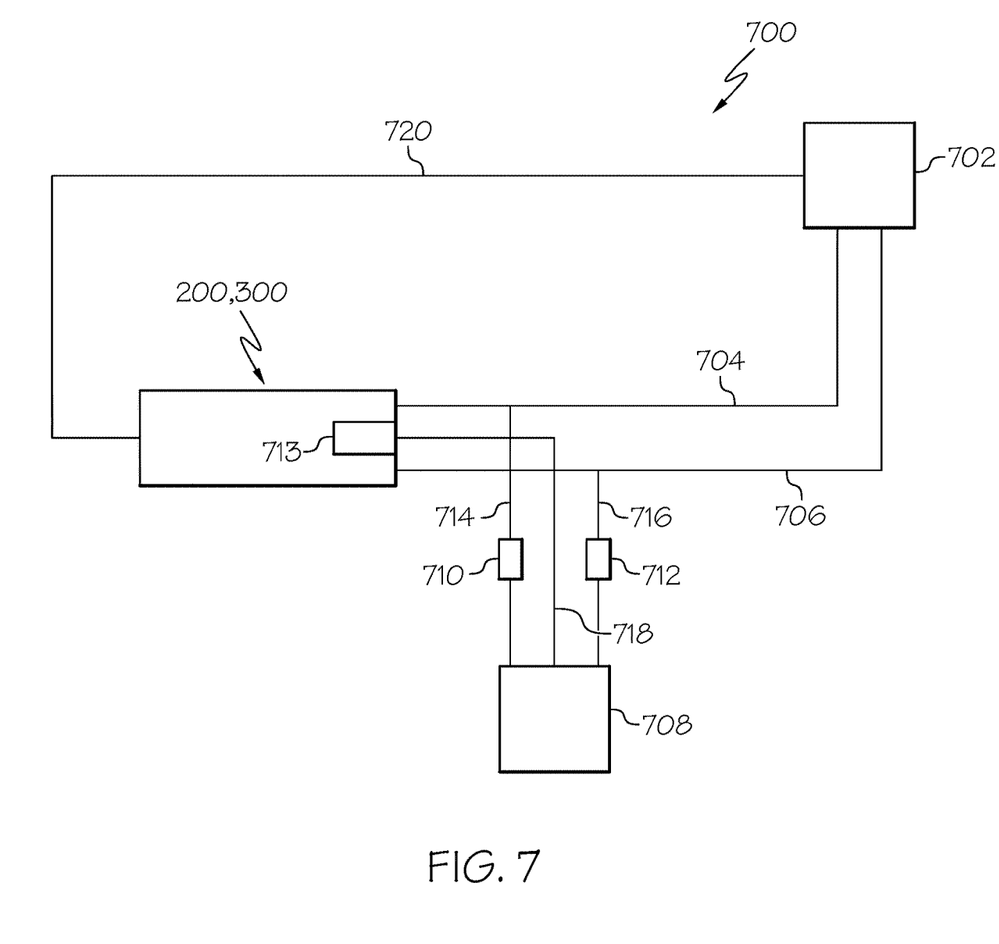
FIG. 7 schematically depicts a sinter fixture temperature control system that utilizes the sinter fixture assembly of FIG. 4 to control the processing of and form TLPS interconnects or joints between a pair of substrates, according to one or more embodiments shown and described herein.

The cooling medium inlet 208 and the cooling medium outlet 210 extend between a first surface 220 and a second surface 222 of the sinter fixture device 200 that are disposed between the sidewalls 223, 225. In the illustrated embodiment, a first leg 212 and a second leg 214 extend from and between outer portions of the first surface 220 and the second surface 222 to, along with an inner bottom portion wall of the base body 202, define a recess 216. The recess 216 defines a space to allow for a spacing from a work surface above which the sinter fixture device 200 is positioned and to allow for a connection between a bracket and the sinter fixture device 200 and, as described in greater detail below. For example, a plurality of leg apertures 218 extends between each of the first leg 212 and the second leg 214 within sidewall portions on respective planes aligned with planes on which the sidewalls 223, 225 are disposed. As described in greater detail below, the plurality of leg apertures 218 are configured to receive fasteners to fasten the sinter fixture device 200 to a first end of a bracket component that has a second end connected to an underlying plate. In embodiments, the sidewalls and other front, rear, and/or bottom surfaces of the sinter fixture device 200 described herein may have other non-rectangular or flat shapes, such as convex or concave surfaces that are within the scope of this disclosure. The sinter fixture device 200 may also include, as shown in FIG. 3, an integrated temperature sensor location 226 sized and shaped for receipt of an integrated temperature sensor 713 (FIG. 7).

Figure 4:
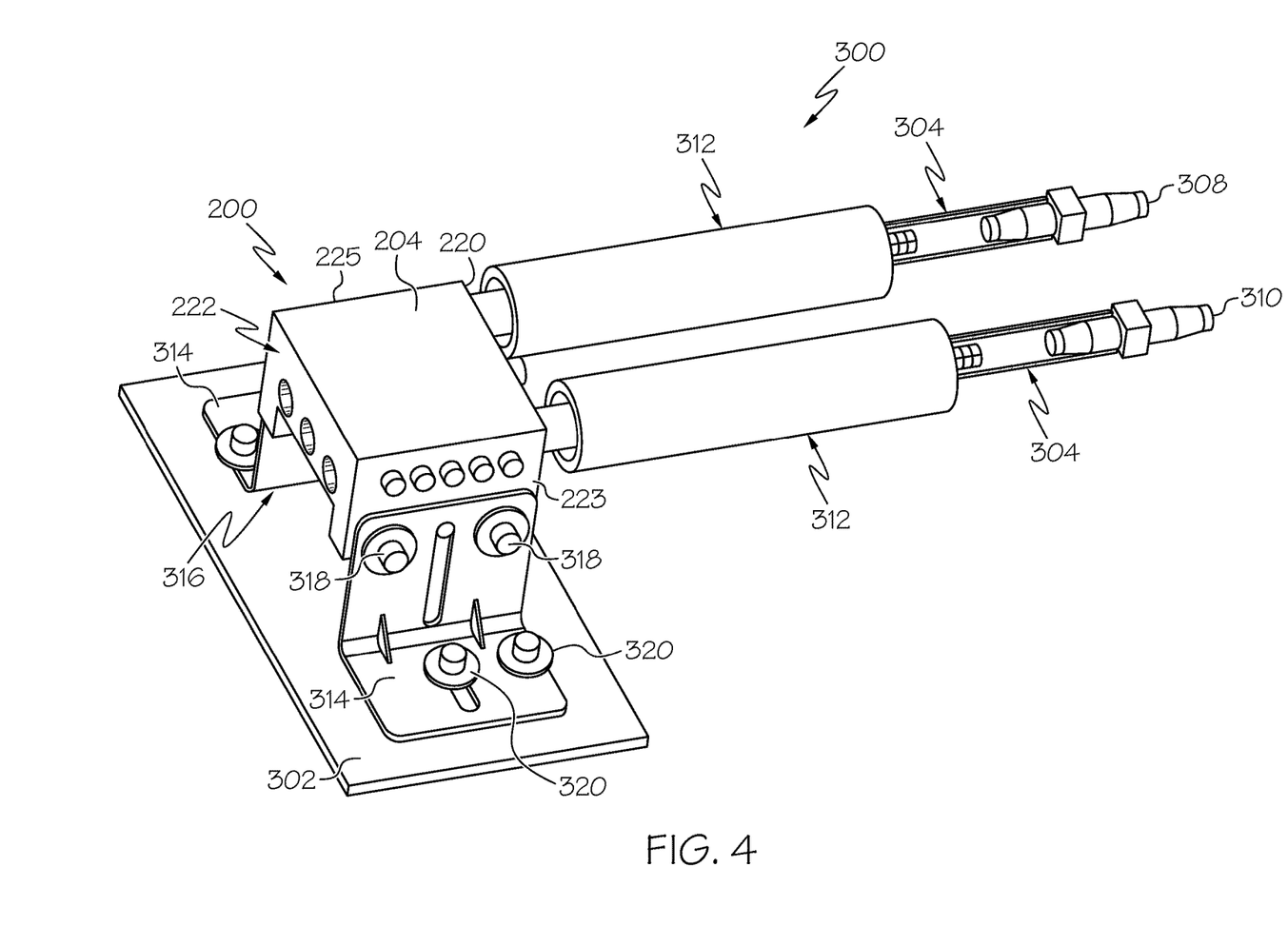
FIG. 4 schematically depicts a side perspective view of the sinter fixture device of FIG. 2 attached to piping components to form a sinter fixture assembly to form TLPS interconnects or joints between a pair of substrates, according to one or more embodiments shown and described herein.

Referring to FIG. 4, the sinter fixture device 200 may be attached to and be a component of a sinter fixture assembly 300. In the sinter fixture assembly 300, the sinter fixture device 200 may be coupled to a support plate 302 that may be, for example, made of steel and/or a suitable like material. A cooling medium inlet coupling 308 defines a passageway for receipt and transportation of a cooling medium and is received within and/or coupled to the cooling medium inlet 208 of the sinter fixture device 200. Similarly, a cooling medium outlet coupling 310 defines a passageway for output and transportation of the cooling medium and is received within and/or coupled to the cooling medium outlet 210 of the sinter fixture device 200. The cooling medium inlet coupling 308 and the cooling medium outlet coupling 310 may be defined within and by portions of high temperature tubing 304 that connects to a pipe adaptor portion and an extension pipe portion, about which portions a pipe shielding 312 may be placed. The pipe shield 312 shields and provides additional insulating thermal protection for the passageways defined by the cooling medium inlet coupling 308 and the cooling medium outlet coupling 310.

Figure 5:
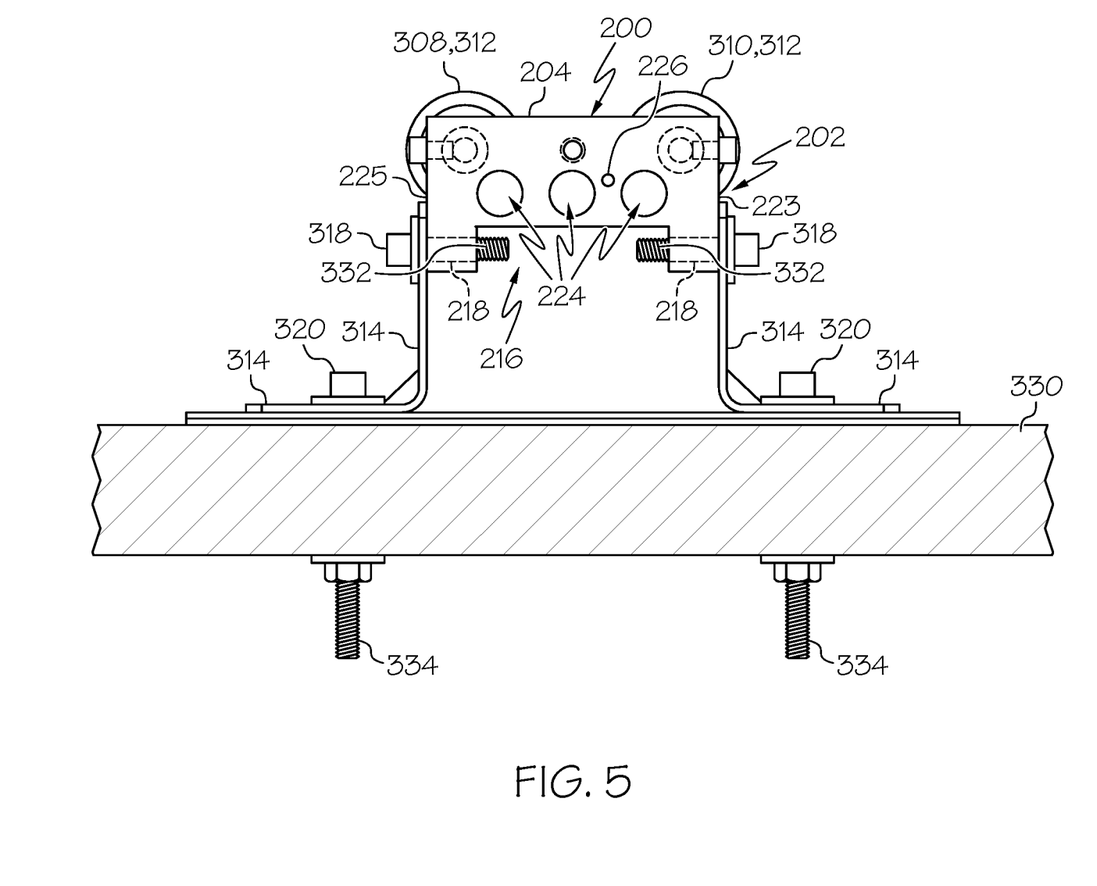
FIG. 5 schematically depicts rear elevation view of the sinter fixture assembly of FIG. 4, according to one or more embodiments shown and described herein.
Figure 6:
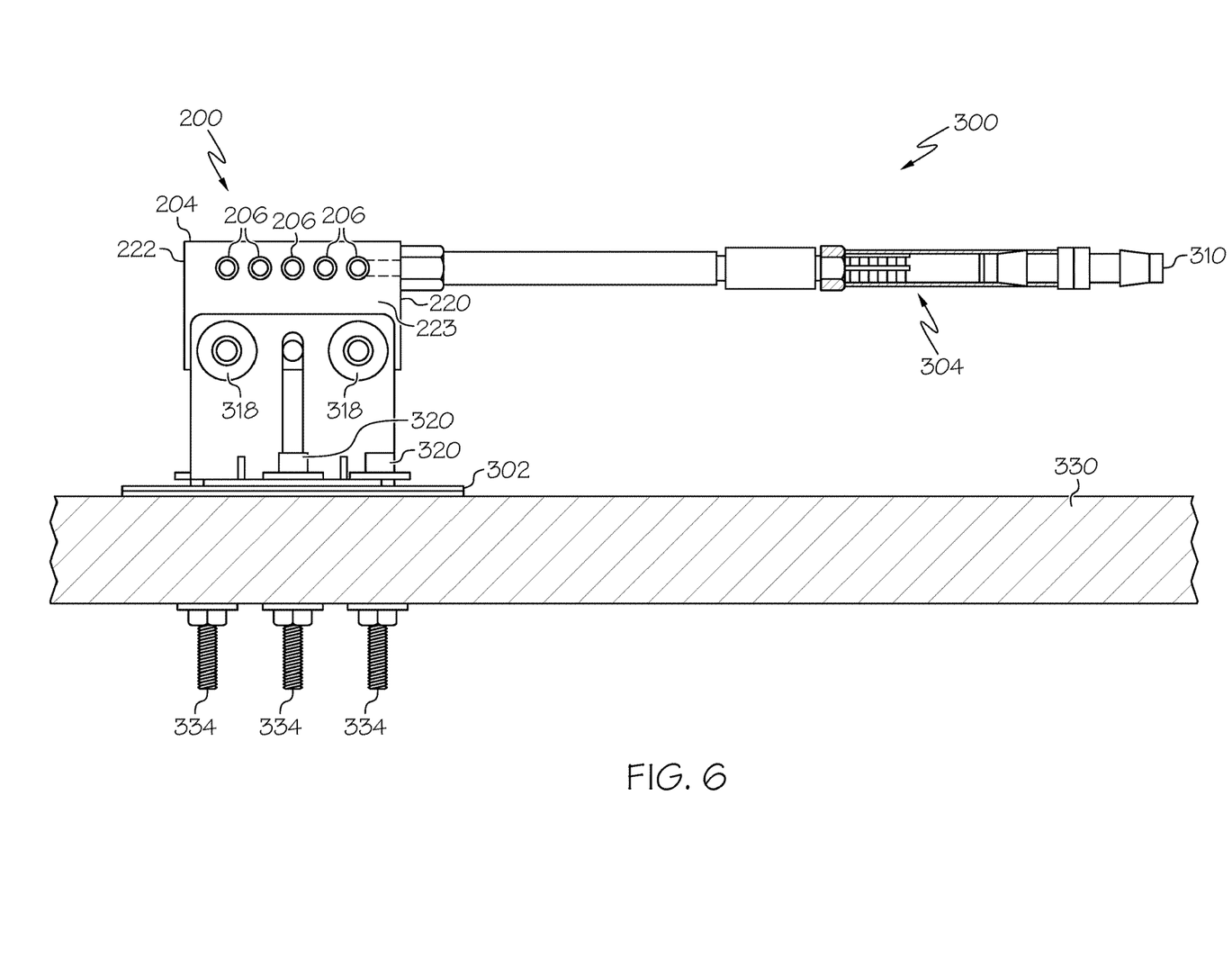
FIG. 6 schematically depicts a side elevation view of the sinter fixture assembly of FIG. 4, according to one or more embodiments shown and described herein.

In embodiments, one or more holding brackets 314 attach the sinter fixture device 200 to the support plate 302 to define, along with recess 216, an overall holding position recess 316 such that the sinter fixture device 200 is spaced from the support plate 302 of the sinter fixture assembly 300. The holding brackets 314 include apertures sized and shaped to receipt fasteners 318, 320. For example, referring to FIGS. 4-5, apertures on an upper portion of a bracket 314 are aligned with and may be connected to leg apertures 218 of the sinter fixture device via fasteners 318 that may include holding screws 332. Referring to FIGS. 5-6, apertures on a bottom portion of the bracket 314 allow for a connection of the bracket 314 to the support plate 302 and to an underlying support, such as one made of a rubber material, and an underlying work surface 330 via fasteners 320 that may include holding screws 334. Other suitable fasteners are within the scope of this disclosure.

FIG. 4 illustrates a side perspective view of the sinter fixture device 200 attached to piping components to form the sinter fixture assembly 300, FIG. 5 illustrates a rear elevation view of the same, and FIG. 6 illustrates a side elevation view of the same. Referring to FIG. 7, a schematic depiction of a sinter fixture temperature control system 700 incorporating the sinter fixture assembly 300 is shown. In embodiments, a system for controlling the processing of high temperature bonding of substrates may include a graphical user interface (GUI) that is communicatively coupled to a controller 702. The controller 702 is communicatively coupled to the sinter fixture assembly 300 via a vacuum line communication path 720, a heating line communication path 704, and a cooling line communication path 706. The heating line communication path 704 may be communicatively coupled to a temperature sensor 710 (remotely located from the sinter fixture device 200) and a temperature controller 708 via a heating line communication path 714. Additionally, the cooling line communication path 706 may be communicatively coupled to a temperature sensor 712 (remotely located from the sinter fixture device 200) and the temperature controller 708 via a cooling line communication path 716. The integrated temperature sensor 713 within the integrated temperature sensor location 226 of and integral with the sinter fixture device 200 may be communicatively coupled to the temperature controller 708. The GUI may show details of the processing control that are accessible at a user workstation such as an a computer, which is associated with at least a server, a database, a wide area network (WAN) such as an intranet or the Internet, or local area network (LAN), and input/output hardware and/or software to send and receive data. Exemplary input/output hardware includes but is not limited to universal serial bus (USB), FireWire, Thunderbolt, LAN port, wireless fidelity (Wi-Fi) card, WiMax card, and/or other hardware for communication with other networks and/or external devices. System components may be communicatively coupled via communication paths as described above (through wires or wirelessly).

The controller 702 and the temperature controller 708 may each include at least one processor and at least one non-transitory computer-readable storage medium, such as memory, that is in communication with at least one processor. Any of the at least one non-transitory computer-readable storage mediums may include respective one or more programming instructions executable by a respective at least one processor to cause the at least one processor to enact steps such as those described below with respect to FIGS. 7-8. Alternatively, the controller 702 may include a controlling processor that is communicatively coupled to the temperature controller 708, and the controller 702 may include a non-transitory computer-readable storage medium in communication with the controlling processor. The non-transitory computer-readable storage medium of the controller 702 may include one or more programming instructions executable by the controlling processor to enact the steps via both the controller 702 and the temperature controller 708 such as those described below with respect to FIGS. 7-8. As another non-limiting example, the controller 702 may incorporate the functionalities of the temperature controller 708 as described below such that a single controller, processor, and non-transitory computer-readable storage medium is associated with the sinter fixture temperature control system 700. As described in greater detail below, the controller 702 and/or the temperature controller 708 are communicatively coupled to the sinter fixture device 200.

Figure 8:
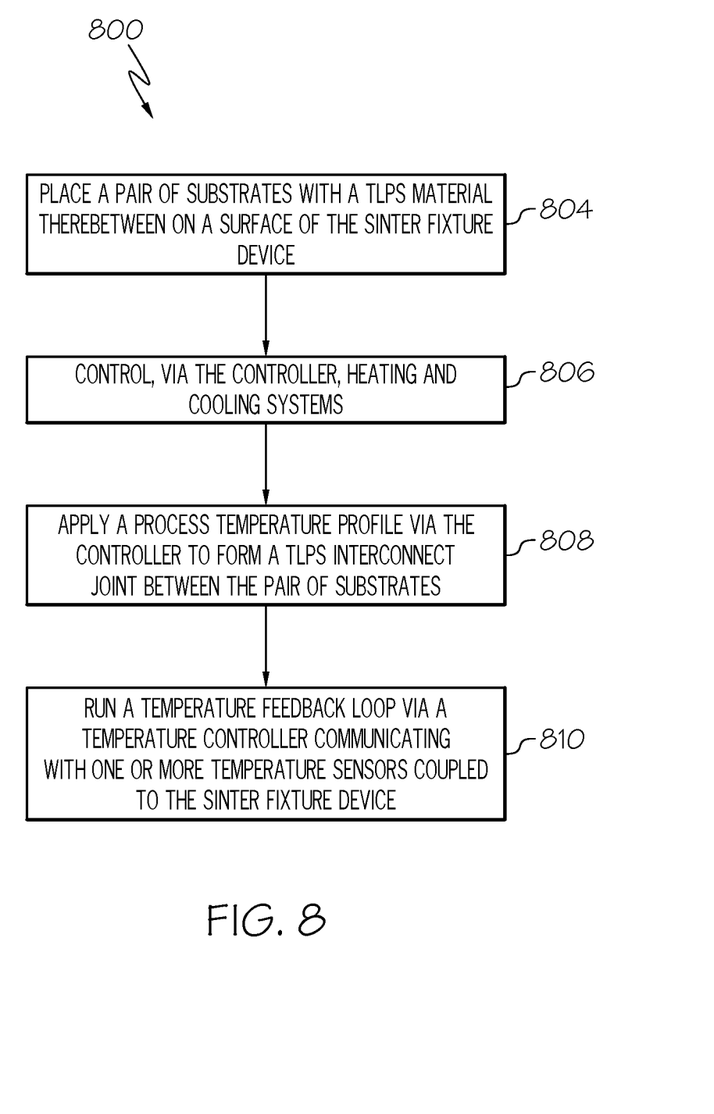
FIG. 8 schematically depicts a method to utilize the sinter fixture temperature control system of FIG. 7 to control the process of forming TLPS interconnects or joints between a pair of substrates, according to one or more embodiments shown and described herein.

Referring to block 804 of FIG. 8, with additional reference to FIGS. 6 and 7, a method 800 for controlled processing of high temperature bonding of substrates positioning a low melting point material and one or more high melting point materials between first and second substrates to form an assembly having a contacting surface and disposing the assembly on the plate surface 204 of the sinter fixture device 200. As described above, the plate surface 204 is shaped to contact and conform to the contacting surface of the assembly. In block 806, one or more heating and cooling systems associated with one or more channels, inlets, and/or outlets 206, 208, and/or 210, respectively, (FIG. 2) disposed below the plate surface 204 of the sinter fixture device 200 may be controlled via the controller 702 and/or the temperature controller 708. Referring to block 808, a process temperature profile may be applied to form a bond layer 112 (FIG. 1B) between the first and second substrates 102, 104. For example, the process temperature profile may specific a plurality of ramping up periods of time in which a temperature of the sinter fixture device 200 is increased and held along with a plurality of cooling down period of time in which the temperature of the sinter fixture device 200 is decreased.

In embodiments, in block 810, a temperature feedback loop may be run via the temperature controller 708 that is associated with the controller 702 and that communicates with one or more temperature sensors 710, 712 coupled to the sinter fixture device 200 and that to transmit signals regarding temperature information (such as a temperature of the sinter fixture device 200 and/or a heating or cooling line in communication with the sinter fixture device 200). The temperature controller 708 may be used with temperature sensors such as temperature sensors 710, 712 as part of a temperature feedback loop in which the temperature sensors 710, 712 and/or other like temperature sensors are positioned at or close to the sinter fixture device 200, or at other locations of interest on the specimen(s) or on the sinter fixture device 200, or, as described above, integrated into the sinter fixture device 200. The coupling of the temperature controller 708 with both the heating and cooling systems as described herein may ensure a reliable, consistent, and repeatable process temperature profile.

Figure 9:
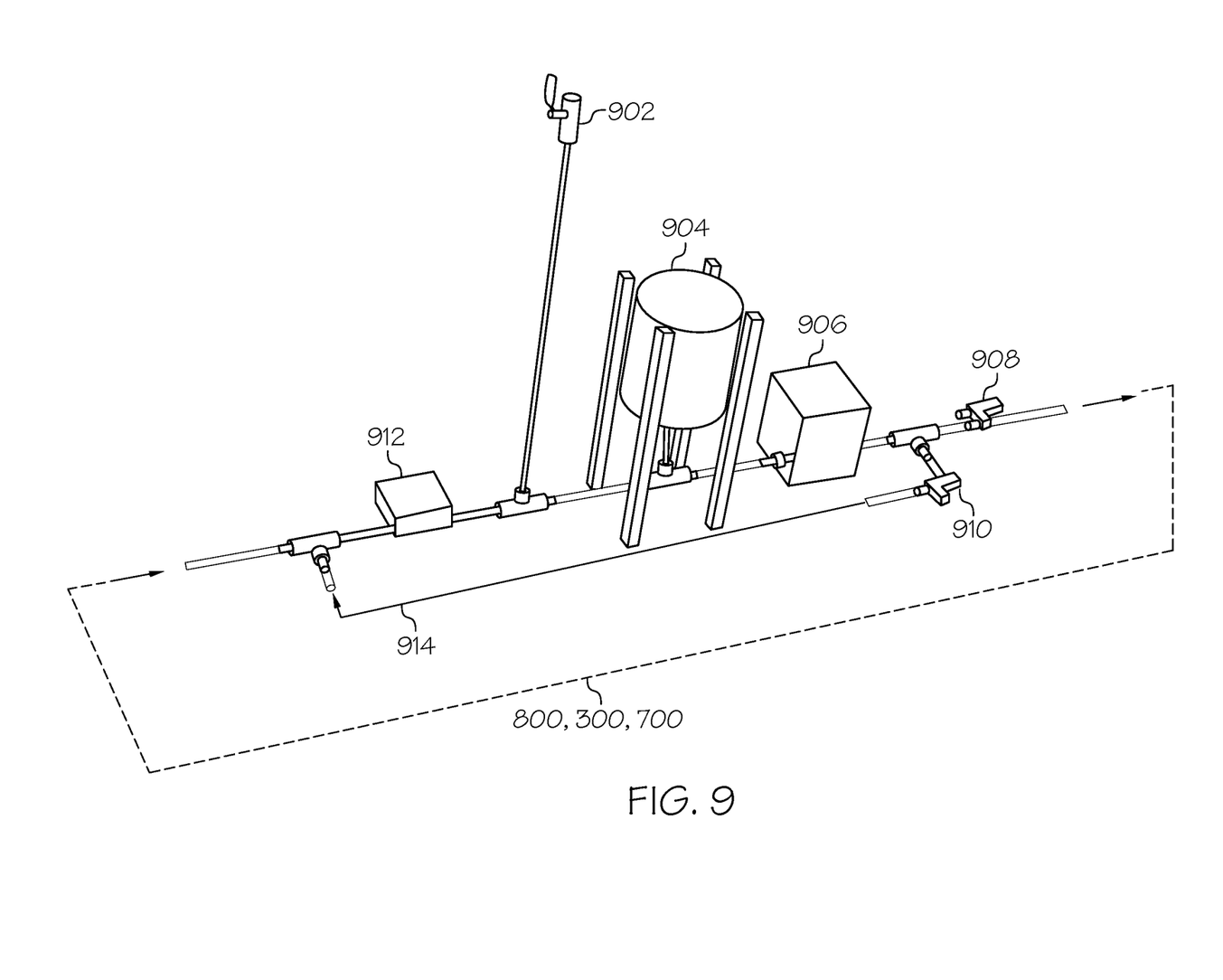
FIG. 9 schematically depicts a double-loop system associated with the sinter fixture temperature control system of FIG. 7 to control the process of forming TLPS interconnects or joints between a pair of substrates, according to one or more embodiments shown and described herein.

Referring to FIG. 9, the sinter fixture temperature control system 700 may be part of a double-loop system 900 that includes a cooling medium inlet valve 902, a tank 904, a pump 906, a normally-off valve 908, a normally-on valve 910, and a radiator and fan device 912. The tank 904 may be an expansion tank or reservoir used, for example, to compensate for potential pressure increases by allowing for heating and/or evaporation of the cooling medium. When no cooling medium is required, the normally-on valve 910 may be activated and be controlled by the temperature controller 708 to pass the cooling medium through a first loop 914 that does not pass through the sinter fixture device 200 of the sinter fixture assembly 300. In the first loop 914, the cooling medium, which may be provided by the cooling medium inlet valve 902, passes through the tank 904, the pump 906, the normally-on valve 910, and the radiator and fan device 912. When a cooling medium is required, the normally-off valve 908 may be actuated and controlled by the temperature controller 708 to pass the cooling medium through a second loop 916 that does pass through the sinter fixture device 200. In the second loop 916, the cooling medium passes through the tank 904, the pump 906, the normally-off valve 908, the sinter fixture temperature control system 700 (and thus the sinter fixture assembly 300 and the sinter fixture device 200), and back to the radiator and fan device 912. The radiator and fan device 912 provides for a cooling of the cooling medium through both loops 914, 916, and the pump 906 provides for a circulation of the cooling medium through both loops 914, 916.

The cooling medium may be a cooling fluid as used in heat transfer devices to receive and remove heat generated by a convective thermal transfer, or thermal energy may be removed by a two-phase heat transfer in which coolant fluid is converted from a liquid phase to a gas phase. Examples of the cooling fluid include, but are not limited to, deionized water and engineering fluids, such as HFE-7100. The cooling medium may be a single phase liquid, single phase gaseous medium, or a two-phase cooling medium with a liquid-to-gaseous phase transformation. The coolant fluid may be provided in a closed system or in a coolant fluid system from which the coolant fluid is cycled to and from a coolant fluid reservoir.

In embodiments, the sinter fixture device 200 may be placed in a vacuum environment during heating and cooling operations, such as TLPS heating or a diffusion soldering, as described herein. Within such a vacuum environment, which operates within and applies vacuum conditions to the sinter fixture device 200, outgassing that only occurs under vacuum conditions (such as an outgassing of hydrogen atoms/gas) may result in an increased wettability and strengthened surface bonding of the bond layer 112, for example. Further, as the sinter fixture device 200 has a generally low thermal mass compared to conventional reflow ovens, the sinter fixture device 200 enables high heating and cooling rates in a TLPS joint zone. Such high rates assist to optimize process control for providing improved joint microstructure control, reduced voiding levels, and high interconnect strength and reliability. It further allows for a low investment cost (i.e., over generally costly conventional multi-zone reflow ovens) and for a good adaptability to multiple sample or specimen geometries. Further, the sinter fixture may be coupled with vacuum environments in contrast to conventional convection-based reflow technologies.

It should now be understood that embodiments described herein are directed to methods and apparatuses for controlled processing of high temperature bonding of substrates to develop a strengthened bonding or bond layer between two bonded substrates or a plurality of substrates. Described herein are methods and apparatuses to form TLPS systems and their joints, which are characterized by highly complex microstructures. The example methods described herein may be used to determine a TLPS sinter joint microstructure that results in a strengthened bond layer between two bonded substrates that may be used to bond semiconductor devices in power electronics applications, for example.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A sintering fixture device for use in a controlled processing of high temperature bonding of substrates, the sintering fixture device comprising:
   a base body comprising a metal that is at least one of copper and aluminum;
   a plate surface that will contact a contacting surface of a substrate assembly, wherein the substrate assembly comprises a low melting point material and one or more high melting point materials between first and second substrates, the one or more high melting point materials having a melting temperature that is higher than a melting temperature of the low melting point material; and
   a plurality of channels below the plate surface within the base body of the sintering fixture device shaped to receive heating and cooling elements, wherein:
      a first set of the plurality of channels includes a plurality of cross-channels, a cooling medium inlet connected to a cooling medium inlet channel, and a cooling medium outlet connected to a cooling medium outlet channel, wherein the cooling medium inlet channel and the cooling medium outlet channel are aligned in a channel plane, and the plurality of cross-channels, the cooling medium inlet, and the cooling medium outlet are in fluid communication with one another, the plurality of cross-channels are spaced apart and non-intersecting; and
      a second set of the plurality of channels includes a plurality of heating element passageways; and
   a pair of legs defining a recess therebetween, the pair of legs extending from the base body on a side opposite the plate surface, wherein each leg of the pair of legs comprises an outer sidewall comprising a plurality of fastener apertures aligned on a fastener plane that is co-aligned with the channel plane, the plurality of fastener apertures for receipt of fasteners to mount the sintering fixture device to a pair of brackets coupled to an underlying surface aligned with the fastener plane such that the recess is spaced from the underlying surface when each leg is mounted to each bracket to improve a thermal contact between the substrate assembly and the plate surface during high temperature bonding.

2. The sintering fixture device of claim 1, wherein the first set of the plurality of channels comprises a pathway for a cooling medium.

3. The sintering fixture device of claim 2, wherein the cooling medium is deionized water.

4. The sintering fixture device of claim 1, wherein the second set of the plurality of channels is positioned away from the first set of the plurality of channels.

5. The sintering fixture device of claim 1, wherein:
   the plurality of cross-channels extend within the sintering fixture device between a pair of sidewalls of the sintering fixture device and are associated with apertures defined in the pair of sidewalls; and
   the cooling medium inlet and the cooling medium outlet are defined by a respective pair of apertures disposed within a first surface of the sintering fixture device that extends between ends of the pair of sidewalls.

6. The sintering fixture device of claim 1, further comprising an integrated temperature sensor to provide temperature readings associated with one or more heating and cooling elements disposed within the plurality of channels.

7. The sintering fixture device of claim 1, further comprising:
   a cooling medium inlet coupling coupled to an inlet high temperature tubing to form a passageway for receipt and transportation of a cooling medium; and
   a cooling medium outlet coupling coupled to an outlet high temperature tubing to form a passageway for output and transportation of the cooling medium;
   wherein the cooling medium inlet coupling is physically coupled to the cooling medium inlet, and the cooling medium outlet coupling is physically coupled to the cooling medium outlet.

8. The sintering fixture device of claim 1, further comprising the pair of brackets and the underlying surface.

9. The sintering fixture device of claim 1, wherein a direction of flow of the plurality of cross-channels is perpendicular to a direction of flow of the cooling medium inlet and a direction of flow of the cooling medium outlet, and the direction of flow of the cooling medium inlet is parallel to the direction of flow of the cooling medium outlet.

10. A system for assessing high temperature bonding of substrates, the system comprising:
    a sintering fixture device comprising a base body comprising a metal that is at least one of copper and aluminum, a plate surface that will contact a contacting surface of a substrate assembly, wherein the substrate assembly comprises a low melting point material and one or more high melting point materials between first and second substrates, the one or more high melting point materials having a melting temperature that is higher than a melting temperature of the low melting point material, and a plurality of channels below the plate surface within the base body shaped to receive heating and cooling elements of heating and cooling systems, wherein:
       a first set of the plurality of channels includes a plurality of cross-channels, a cooling medium inlet connected to a cooling medium inlet channel, and a cooling medium outlet connected to a cooling medium outlet channel, wherein the cooling medium inlet channel and the cooling medium outlet channel are aligned in a channel plane, and the plurality of cross-channels, the cooling medium inlet, and the cooling medium outlet are in fluid communication with one another, the plurality of cross-channels are spaced apart and non-intersecting,
       a second set of the plurality of channels includes a plurality of heating element passageways, and
       the sintering fixture device comprises a pair of legs defining a recess therebetween, the pair of legs extending from the base body on a side opposite the plate surface, wherein each leg of the pair of legs comprises an outer sidewall comprising a plurality of fastener apertures aligned on a fastener plane that is co-aligned with the channel plane, the plurality of fastener apertures for receipt of fasteners to mount the sintering fixture device to a pair of brackets coupled to an underlying surface aligned with the fastener plane such that the recess is spaced from the underlying surface when each leg is mounted to each bracket to improve a thermal contact between the substrate assembly and the plate surface during high temperature bonding;

the substrate assembly disposed on the plate surface of the sintering fixture device;

a processor; and a non-transitory computer-readable storage medium in communication with the processor, the non-transitory computer-readable storage medium including one or more programming instructions executable by the processor to cause the processor to:

control heating elements associated with the second set of the plurality of channels of the sintering fixture device and a flow of a cooling fluid through the first set of the plurality of channels of the sintering fixture device to achieve a process temperature profile to form a bond layer between the first and second substrates.

11. The system of claim 10, further comprising one or more temperature sensors in communication with the sintering fixture device, the one or more programming instructions executable by the processor to cause the processor to receive temperature information from the one or more temperature sensors.

12. The system of claim 10, the one or more programming instructions are executable by the processor to cause the processor to monitor a level of outgassing when the process temperature profile is applied to the substrate assembly disposed on the sintering fixture device within a vacuum environment to form the bond layer between the first and second substrates.

13. The system of claim 10, wherein a cooling medium inlet coupling is physically coupled to the cooling medium inlet channel, and a cooling medium outlet coupling is physically coupled to the cooling medium outlet channel.

14. The system of claim 13, wherein:
the second set of the plurality of channels is positioned away from the first set of the plurality of channels.

15. The system of claim 10, wherein the sintering fixture device further comprises:

a cooling medium inlet coupling coupled to an inlet high temperature tubing to form a passageway for receipt and transportation of a cooling medium; and a cooling medium outlet coupling coupled to an outlet high temperature tubing to form a passageway for output and transportation of the cooling medium, wherein each of the cooling medium inlet coupling and the cooling medium outlet coupling is physically coupled to the respective the cooling medium inlet channel or the cooling medium outlet channel.

16. The system of claim 10, wherein the sintering fixture device further comprises the pair of brackets and the underlying surface.

17. The system of claim 10, wherein a direction of flow of the plurality of cross-channels is perpendicular to a direction of flow of the cooling medium inlet and a direction of flow of the cooling medium outlet, and the direction of flow of the cooling medium inlet is parallel to the direction of flow of the cooling medium outlet.

* * * * *

UNITED STATES PATENT AND TRADEMARK OFFICE
CERTIFICATE OF CORRECTION

PATENT NO. : 10,500,661 B2
APPLICATION NO. : 15/344532
DATED : July 14, 2020
INVENTOR(S) : Hannes Martin Hinrich Greve, F. Patrick McCluskey and Shailesh N. Joshi It is certified that error appears in the above-identified patent and that said Letters Patent is hereby corrected as shown below:

On the Title Page

Item (73) Assignee(s) should read:
Toyota Motor Engineering & Manufacturing North America, Inc. Plano, TX (US); University of Maryland, College Park, MD (US)

Signed and Sealed this
Twenty-seventh Day of October, 2020

Andrei Iancu
*Director of the United States Patent and Trademark Office*